United States Patent
Mangold

(10) Patent No.: US 6,232,550 B1
(45) Date of Patent: May 15, 2001

(54) MODULE CARRIER WITH SHEET METAL COVERS

(75) Inventor: Urs Mangold, Auslikon (CH)

(73) Assignee: ELMA Electronic AG, Wetzikon (CH)

(*) Notice: Subject to any disclaimer, the term of this patent is extended or adjusted under 35 U.S.C. 154(b) by 0 days.

(21) Appl. No.: 09/067,613

(22) Filed: Apr. 28, 1998

(30) Foreign Application Priority Data

Apr. 29, 1997 (DE) .......................................... 297 07 756 U

(51) Int. Cl.$^7$ ........................................................ H02G 3/08
(52) U.S. Cl. ........................ 174/52.1; 174/35 R; 361/679; 361/816; 361/818
(58) Field of Search ................................ 174/52.1, 35 R; 361/728, 729, 730, 816, 818, 679

(56) References Cited

U.S. PATENT DOCUMENTS

| | | | |
|---|---|---|---|
| 5,043,528 | * 8/1991 | Mohr | 174/35 GC |
| 5,267,125 | * 11/1993 | Liu | 361/816 |
| 5,353,201 | * 10/1994 | Maeda | 361/816 |
| 5,354,951 | * 10/1994 | Lange, Sr. et al. | 174/35 R |
| 5,508,889 | * 4/1996 | Ii | 361/816 |
| 5,576,513 | * 11/1996 | Gunther et al. | 174/35 R |
| 5,742,488 | * 4/1998 | Lonka et al. | 361/816 |
| 5,905,641 | * 5/1999 | John et al. | 361/818 |

FOREIGN PATENT DOCUMENTS

| | | |
|---|---|---|
| 1938879 | 12/1971 | (DE) . |
| 4132387A1 | 4/1993 | (DE) . |
| 295 02 404 U1 | 3/1996 | (DE) . |
| 296 18 628 U1 | 1/1997 | (DE) . |

\* cited by examiner

*Primary Examiner*—Dean A. Reichard
*Assistant Examiner*—W. David Walkenhorst
(74) *Attorney, Agent, or Firm*—Townsend and Townsend and Crew LLP

(57) ABSTRACT

The invention of module carriers made of sheet metal is shown. The module carrier has a sheet metal cover from which a cover flange extends. A side plate of the module carrier has strips which are formed out on a straight line in order to form insertion eyes which are engaged by tongues of the cover flange. Contact springs are cut free in the cover flange, and they have knobs at their ends which are arranged to protrude outwardly as contact points. Since the insertion eyes, the insertion tongues and the contact springs are arranged on the inner side of the module carrier housing so as to be protected, smooth outer surfaces are obtained and contact springs with a long permissible travel can be chosen.

12 Claims, 4 Drawing Sheets

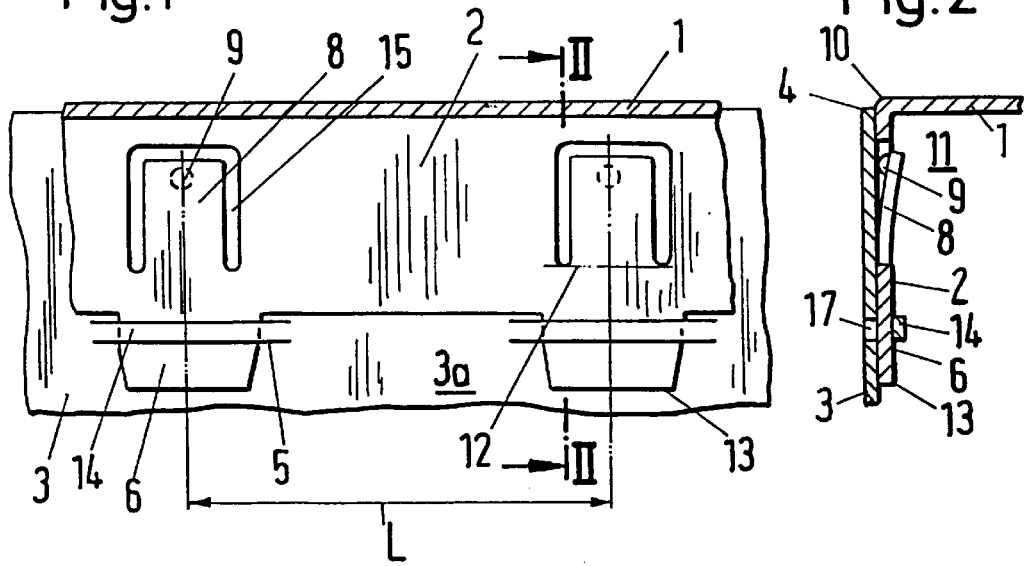
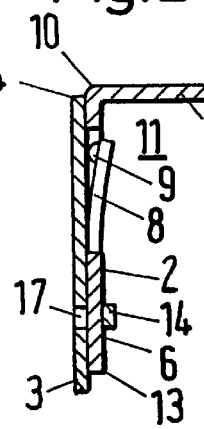
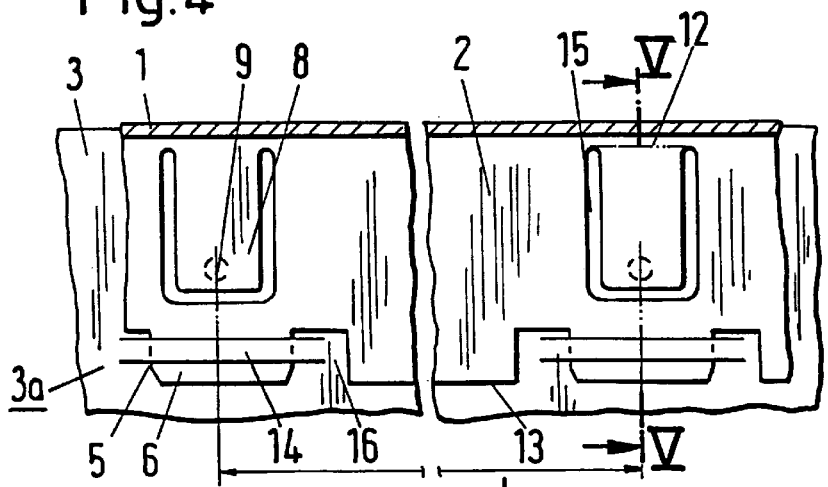
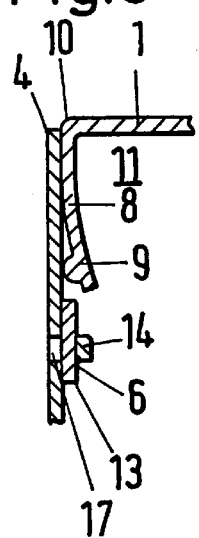
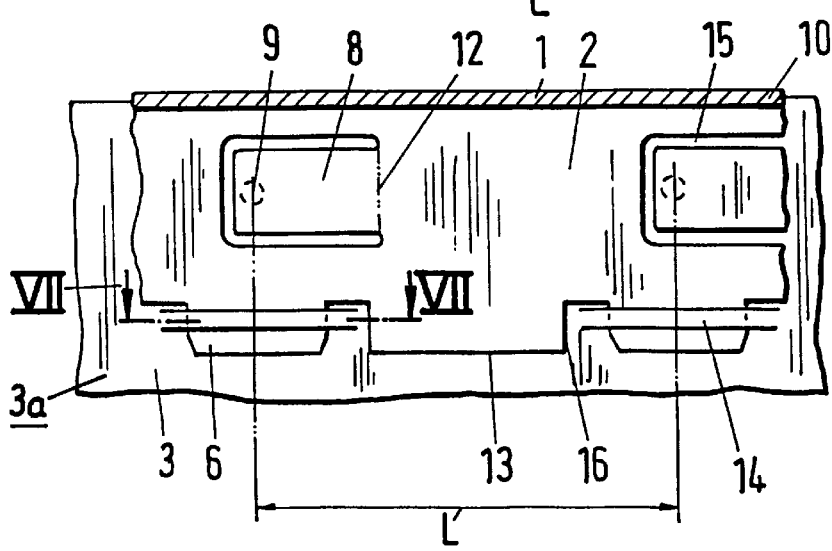

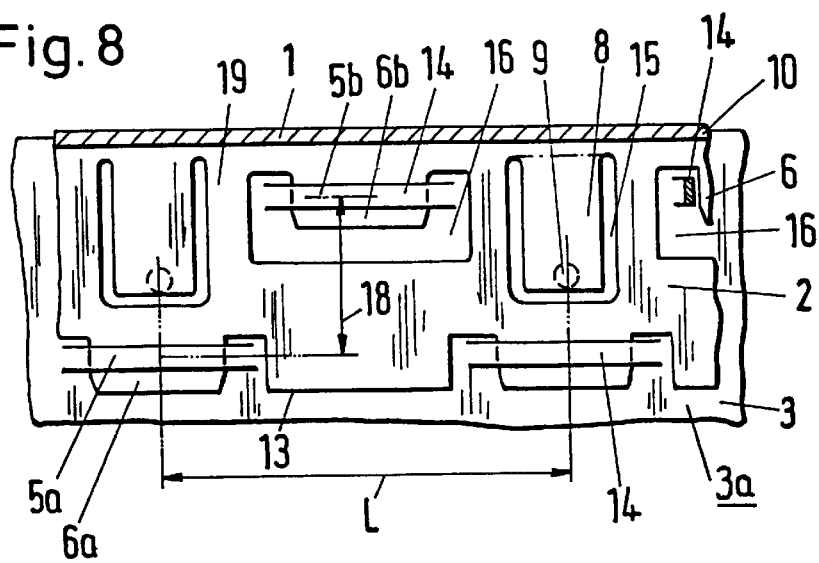
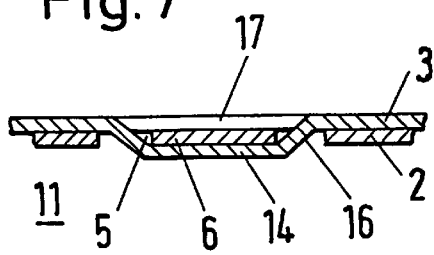
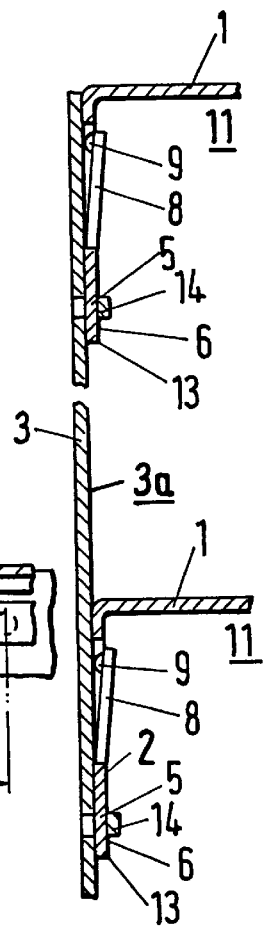
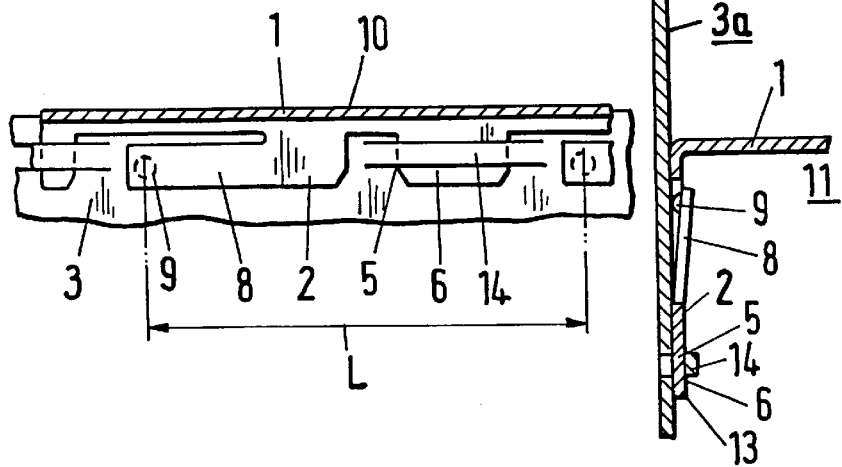

MODULE CARRIER WITH SHEET METAL COVERS

BACKGROUND OF THE INVENTION

The invention relates to a module carrier having spaced-apart sheet metal side plates and a sheet metal cover disposed between and attached to the side plates. The cover is formed by a cover plate and flanges or segments which depend from the cover plate and engage the side plate. The side plate has strips which are parallel to an edge of the side plate and forms eyes into which tongues of the cover flange can be inserted.

Module carriers for electrical and electronic components are for example defined in the norms of the IEC standards for the chasses and components of the 19-inch technology, and various manufacturers offer module carriers in this technology. Thus a brochure of the company Knürr AG, Schatzbogen 29, D-81829 Munich, shows 19-inch module carriers/VME system in the 1997 catalogue of which the sheet metal cover is bent off and inserted with its individual tongues into strips in side parts which protrude outwardly. Other tongues of the bent-off angle piece are connected to the side parts with screws. This connection has the disadvantage that temporally unlimited contact forces which are required for a screening arise at the screw connections with certainty, whereas an admittedly good primary anchoring and a good primary contacting can be achieved with the inserted tongues, but a long-term contacting is however not so certain. A further disadvantage is the contours of the angle piece, the tongues, the screw heads and the strips, which protrude with respect to the plane of the side parts and provide obstacles for hard objects.

SUMMARY OF THE INVENTION

It is an object of the invention to provide a force-locked, repeatedly insertable connection between the cover and the side plates of an electronic module carrier.

This object is satisfied by arranging the cover segment and the eyes on the inner side of the module carrier. Contact springs are cut free on the cover plate and knobs are arranged on the outer sides of the springs which produce a predetermined contact force when the cover is in its inserted position.

The arrangement has the advantage that through the protected arrangement, contact springs can be chosen which are sufficiently long and elastic in order to produce permanent contact surfaces independently of vibrations and shocks. Although formed of the same sheet metal, contact springs with a long resiliency path are possible. With knobs which are pressed out of the sheet metal, the same material can be chosen for the contact in order to reduce the risk of corrosion due to differing electrochemical potentials. If the contact springs and insertion tongues are placed close to one another spatially, the embossing of the knobs, the cutting free of the contact springs and the cutting free of the insertion tongues can be combined in one tool and the distance L between two contact points along the bending edge of an angle piece can be chosen freely corresponding to the screening requirements through a mere displacement of the worked article. If larger bending torques are to be transmitted between the angle piece and the sheet metal cover, eyes and insertion tongues can be arranged at alternating distances from the bending edge of the angle piece and thus, seen on the average over the distance of the strips, take up bending torques in both directions. It is essential that the elastic reset of the contact springs be great enough in order to produce sufficiently large contact forces in spite of micro-movements. A further advantage results if the knobs are arranged in the vicinity of the insertions since the tolerances are taken up on insertion within a comparably large elastic travel of the contact springs.

BRIEF DESCRIPTION OF THE DRAWINGS

The invention will be explained with reference to the following drawings:

FIG. 1 is a partial, interior view of the connection between the cover and a side plate of a module carrier constructed in accordance with the invention;

FIG. 2 is a longitudinal section through FIG. 1 along line II—II;

FIG. 3 shows an arrangement as in FIG. 2 in which two spaced-apart covers are connected to a side plate;

FIG. 4 shows an arrangement as in FIG. 1 in which the knobs were placed in the vicinity of the insertion tongues;

FIG. 5 is a longitudinal section taken along line V—V of FIG. 4;

FIG. 6 shows an arrangement in which the base of the contact springs is transverse to a bending edge between the cover plate and the cover flange;

FIG. 7 is a partial cross-section of FIG. 6 which shows the tongue inserted in an eye;

FIG. 8 shows an arrangement in accordance with FIG. 4 in which, to a first row of insertion tongues and eyes, a further row of insertion tongues and eyes was added with a displacement by a distance from the bending edge;

FIG. 9 shows an arrangement analogous to FIG. 6 in which the resiliency length of the contact springs is greater than the height of the angle piece;

DETAILED DESCRIPTION OF THE PREFERRED EMBODIMENTS

Figure 12:
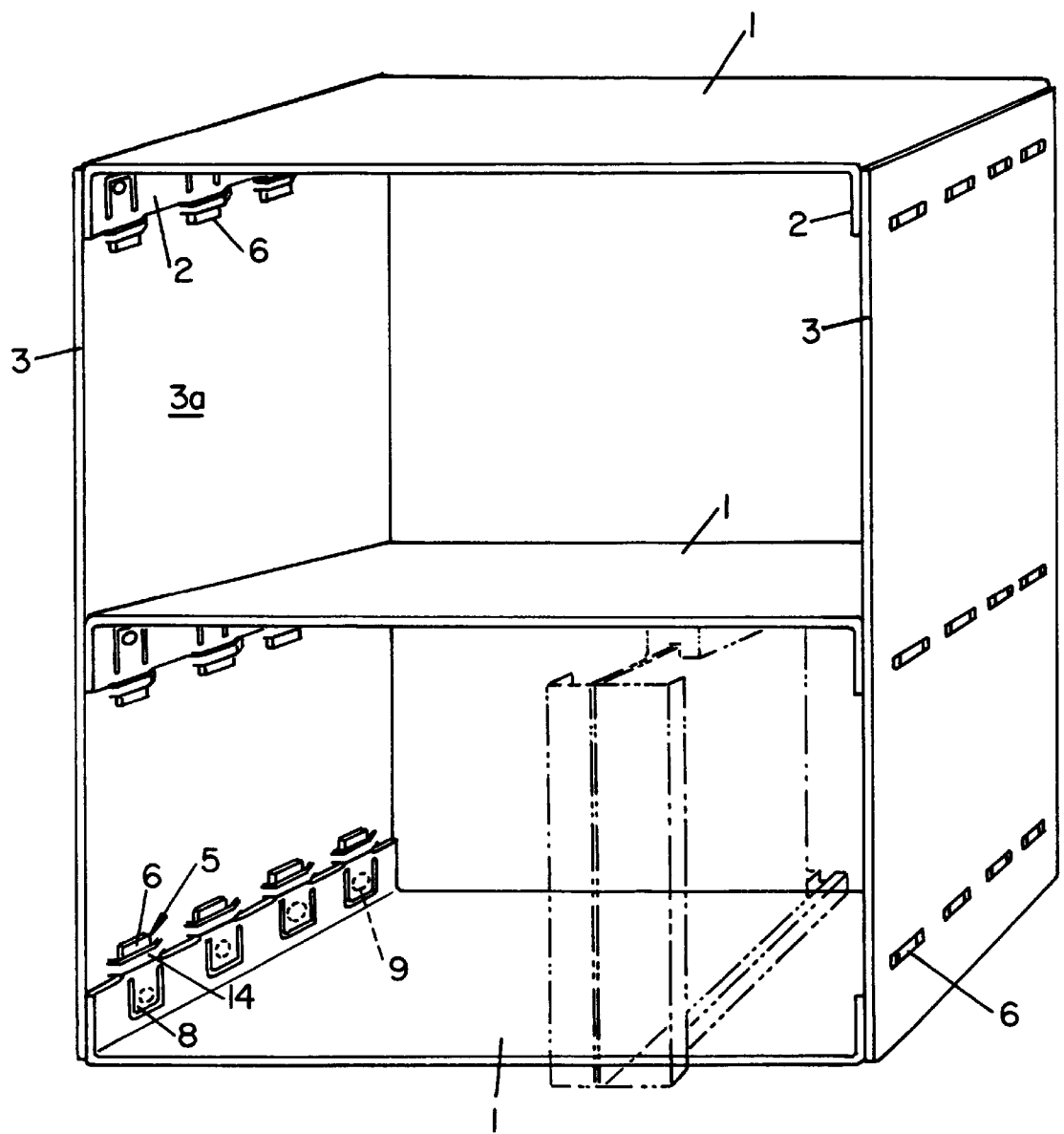
FIG. 12 is a perspective front elevational view of the module carrier of the present invention.

Referring to FIG. 12, a module carrier constructed in accordance with the present invention is formed by spaced-apart side plates 3 and covers 1 disposed between (inside of) the side plates. Each cover has a cover plate and cover flanges or segments which depend perpendicularly from the cover plate and abut against insides 3a of the side plates. The covers are connected to the side plates with tongues 6 formed by the cover flanges, e.g. depending from an end edge thereof, and which engage eyes which are formed by cutting strips 14 free of the side plates and deforming (pushing) them inwardly of inside 3a of the side plates. The cover flanges include springs 8, each of which has an outwardly facing knob 9 and which are biased outwardly so that the knobs engage the insides of the side plates and thereby generate a predetermined holding force between the side plates and the cover flanges.

As is also seen in FIG. 12, all elements which form the connection between the cover and the side plates, that is, strips 14, eyes 5 defined by them, tongues 6 and springs 8, are disposed on the inside of the side plates and none of them protrude to the exterior thereof. The exterior surfaces of the cover and the side plates are smooth and unobstructed by protruding elements, and only the apertures in the side plates, formed when strips 14 are pushed inwardly, are visible.

Referring to FIGS. 1, 2 and 12, cover flanges 2 are formed by bending the lateral sides of cover 1 along a bending edge 10. The cover flanges are secured to side plates 3 by a push connection located on the inner side 11 of the module carrier by slidably moving, or pushing, the cover relative to the side plates into its inserted position. Strip 14 is formed by cutting two spaced-apart, parallel slits 17 into the side plate to form eyes 5 each of which receives a tongue 6 of the cover flange. In the inserted position, end edges 13 of tongues 6 project beyond strips 14 so that the tongue is fully engaged by the side plate and the strip to enable it to take up bending forces to a limited extent. Knobs 9 are formed at free ends of contact springs. The knobs are formed with a deforming tool so that they face outwardly, towards the side plates, and contact springs 8 are produced by forming trough-shaped cut-outs 15 at selectable spacings "L". A base 12 of each contact spring 8 is parallel to bending edge 10 of the cover and extends between respective ends of the trough-shaped cut-out. The contact springs extend from base 12 counter to the direction in which the cover is moved during assembly so that a jolting of the contact springs 8 is excluded. The position of the knobs 9 with respect to the tongues 6 can be chosen in such a manner that the tongues 6 engage eyes 5 on insertion of the cover before the knobs 9 encounter side plate 3.

In FIGS. 4 and 5 the direction of the contact springs is reversed, and the rise of the contact knobs 9 in the insertion direction is made correspondingly gentle, with a rounding of the edge 4 of the side plate likewise helping out. The arrangement has the advantage that the contact and a relatively long contact spring travel lie in the vicinity of the tongue 6 and the insertion eye 5, with the spring travel or the height of the knob 9 quite generally amounting to more than four times the possible clearance between the insertion eye 5 and the insertion tongue 6. The shape of the insertion tongues 6 is attained by providing recesses 16 at edge 13 of the cover flange 2, with the recesses 16 being chosen sufficiently large so that they leave the protruding eyes free during the assembly, but nevertheless being so small in their dimensions that they can be manufactured with the contact spring 8 in a tool for the cut-out 15. The distance L between the contact springs can then be freely chosen and is no longer dependent on the tool.

In FIGS. 6 and 7 the contact springs 8 are arranged with their bases 12 transverse to the bending edge 10 of the cover. The length of the contact springs or of the cut-out 15 is thereby less dependent on the height of cover flange 2. Nevertheless, the length L for the spacing of the contact points can still be freely chosen and could be made smaller up to an omission of the edge 13 between two recesses 16. The remaining designations agree with the previously described figures.

A further development of the example in FIGS. 6 and 7 is shown in FIG. 9. Push-on connections with a tongue 6 and an eye 5 follow one upon the other with contact springs 8 along cover flange 2 practically at the same short distance from the bending edge 10. The height of the cover flange is kept small. Nevertheless the contact spring length can be considerably greater than the height of the cover flange. The distance L between two contact points can in return be shortened only to the sum of the minimum length part of the contact spring 8 and its lateral support as well as of the minimum length part for the connection of the tongue 6 and the eye 5.

A further example is shown in FIG. 8 in which the tongues 6a, 6b can be kept very short because they are distributed over two different distances to the bending edge 10 of the cover. Moments can be transmitted in both directions via the cover flange 2 due to a distance 18 between the tongues 6a, 6b and the associated eyes 5a, 5b. A prerequisite for this connection is that side plate 3 with its eye 5b can be inserted laterally into a cut-out 16 in cover flange 2 in order to permit the insertion of the tongue 6b. In this example also the distance L of the contact points is dependent on the sum of the dimensions for insertion and for the contact spring, with cross-pieces 19 being required for the acceptance of the forces from the tongues 6a at the edge 13 of the cover flange 2.

It is shown in FIGS. 3 and 12, through the two-fold repetition of FIG. 2, that a second cover 1 with cover flange 2 can also be used further inwardly in the housing for the production of a T connection, with the advantages of the contact springs 8 and the type of the connection with tongue 6 and eye 5 being retained.

Figure 11:
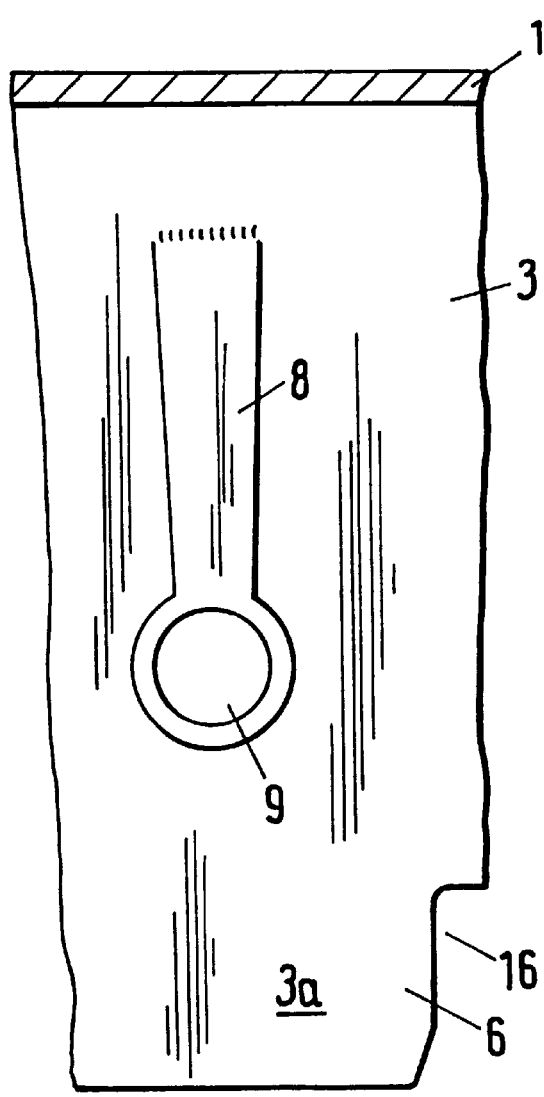
FIG. 11 is a side view of FIG. 10 taken in the direction "XI"
Figure 10:
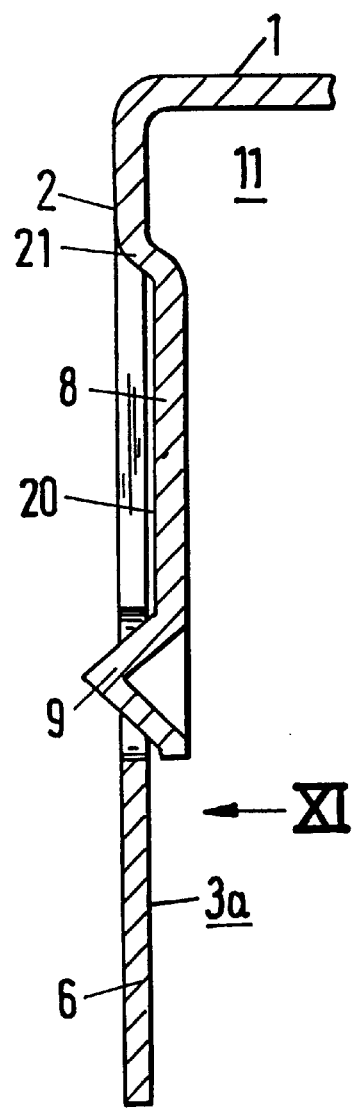
FIG. 10 is a greatly enlarged longitudinal section through a cover flange in which the contact spring is formed inwardly out of the plane of the sheet metal, whereas the knob is formed passing outwardly through the sheet metal.

A contact spring 8 is shown in FIGS. 10 and 11 which can generally be formed out of cover flange 2 in order to contact a surface lying in contact with the cover flange. The contact spring 8 is formed inward at its foot in a compression zone 21 to such an extent that it is separated from the cover flange by a clearance 20, whereas a conically formed knob 9 is pressed outwards in the opposite direction to such an extent that it passes through the sheet metal plane of the cover flange in the unstressed state and protrudes on the opposite side. An advantage of this arrangement is that the contact spring 8 cannot be overstressed since it is stressed only up to the disappearance of the peak of the knob. A further advantage is that the contact spring can be manufactured with a single deformation tool in which a cut along the contact spring replaces cut-outs 15. A further advantage is that the contact spring 8 with its variation in width from the knob toward the foot can be matched to the material of the sheet metal for a predetermined contact force. In soft aluminum sheet metal it proved to be a further advantage that a strengthening arises through the compression zone 21, which increases the elasticity limit in this region.

What is claimed is:

1. A module carrier comprising an outer sheet metal side plate and a sheet metal cover disposed on an inside of the side plate and movable relative to the side plate into an inserted position, the cover being defined by first and second, angularly inclined sheet metal segments, the first segment of the cover being located on an inside of the side plate, strips formed in the side plate, oriented perpendicular to a direction in which the cover is movable relative to the side plate and being deformed inwardly relative to a remainder of the side plate to define an eye disposed on the inside of the side plate, the first segment including projecting tongues positioned and shaped to extend through the eyes on the side plate when the cover is in the inserted position, and contact springs cut free in the first segment, each spring including a knob projecting outwardly past an outer surface of the first segment when the spring is relaxed so that, when the cover is in the inserted position, the knobs resiliently engage an inside of the side plate and produce a predetermined contact force between the first segment and the side plate when the tongues extend into the eyes, wherein each spring is formed by a generally trough-shaped cut in the first segment and is connected with the first segment at a base of the spring extending between ends of the trough-shaped cut, and wherein the base is parallel to a free edge of the first segment.

2. A module carrier in accordance with claim 1 wherein the first segment terminates in an edge, the tongues project from the edge, and the springs are formed on a side of the edge opposite from the tongues.

3. A module carrier according to claim 1 wherein the knobs are defined by pressed-out portions of the sheet metal segment.

4. A module carrier according to claim 1 wherein the springs can be elastically deformed relative to the first segment over a given distance, and wherein the knobs project from a remainder of the spring an amount which is less than a predetermined distance.

5. A module carrier according to claim 1 wherein the contact springs, in their relaxed state, extend inwardly from the first cover segment by a given distance, wherein the knob of each spring extends outwardly from the spring in its relaxed state by an amount so that a peak of the knob extends past an outer side of the first segment by a predetermined travel distance for the spring so that, when the cover is in the inserted position, the peak is in alignment with the outer side of the first segment.

6. A module carrier in accordance with claim 1 wherein the side plate and the cover are dimensioned to fit in a 19-inch module carrier.

7. A module carrier comprising an outer sheet metal side plate and a sheet metal cover disposed on an inside of the side plate and movable relative to the side plate into an inserted position, the cover being defined by first and second, angularly inclined sheet metal segments, the first segment of the cover being located on an inside of the side plate, strips formed in the side plate, oriented perpendicular to a direction in which the cover is movable relative to the side plate and being deformed inwardly relative to a remainder of the side plate to define an eye disposed on the inside of the side plate, the first segment including projecting tongues positioned and shaped to extend through the eyes on the side plate when the cover is in the inserted position, and contact springs cut free in the first segment, each spring including a knob projecting outwardly past an outer surface of the first segment when the spring is relaxed so that, when the cover is in the inserted position, the knobs resiliently engage an inside of the side plate and produce a predetermined contact force between the first segment and the side plate when the tongues extend into the eyes, wherein each spring is formed by a trough-shaped cut in the first segment and connected to the first segment at the base of the spring between ends of the trough-shaped cut, and wherein the base is transverse to a bending line between the first and second segments of the cover.

8. A module carrier according to claim 7 wherein the knobs are defined by pressed-out portions of the sheet metal segment.

9. A module carrier according to claim 7 wherein the springs can be elastically deformed relative to the first segment over a given distance, and wherein the knobs project from a remainder of the spring an amount which is less than a predetermined distance.

10. A module carrier according to claim 7 wherein the contact springs, in their relaxed state, extend inwardly from the first cover segment by a given distance, wherein the knob of each spring extends outwardly from the spring in its relaxed state by an amount so that a peak of the knob extends past an outer side of the first segment by a predetermined travel distance for the spring so that, when the cover is in the inserted position, the peak is in alignment with the outer side of the first segment.

11. A module carrier in accordance with claim 7 wherein the side plate and the cover are dimensioned to fit in a 19-inch module carrier.

12. A module carrier comprising an outer sheet metal side plate and a sheet metal cover disposed on an inside of the side plate and movable relative to the side plate into an inserted position, the cover being defined by first and second, angularly inclined sheet metal segments, the first segment of the cover being located on an inside of the side plate, strips formed in the side plate, oriented perpendicular to a direction in which the cover is movable relative to the side plate and being deformed inwardly relative to a remainder of the side plate to define an eye disposed on the inside of the side plate, the first segment including projecting tongues positioned and shaped to extend through the eyes on the side plate when the cover is in the inserted position, and contact springs cut free in the first segment, each spring including a knob projecting outwardly past an outer surface of the first segment when the spring is relaxed so that, when the cover is in the inserted position, the knobs resiliently engage an inside of the side plate and produce a predetermined contact force between the first segment and the side plate when the tongues extend into the eyes, wherein the first and second cover segments form a bending edge between them, wherein the spacing between the bending edge and at least some of the tongues is different, and wherein spaces between an end edge of the side plate and at least some of the strips correspondingly differ so that all cooperating tongues engage associated eyes when the cover is in the inserted position.

* * * * *